(12) United States Patent
Mantl et al.

(10) Patent No.: US 7,416,965 B2
(45) Date of Patent: Aug. 26, 2008

(54) METHOD FOR PRODUCING A STRAINED LAYER ON A SUBSTRATE AND CORRESPONDING LAYER STRUCTURE

(75) Inventors: Siegfried Mantl, Jülich (DE); Bernhard Holländer, Bergisch Gladbach (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/553,562

(22) PCT Filed: Apr. 15, 2004

(86) PCT No.: PCT/DE2004/000780

§ 371 (c)(1),
(2), (4) Date: Oct. 18, 2005

(87) PCT Pub. No.: WO2004/095553

PCT Pub. Date: Nov. 4, 2004

(65) Prior Publication Data

US 2006/0211221 A1    Sep. 21, 2006

(30) Foreign Application Priority Data

Apr. 22, 2003   (DE) ................................ 103 18 284

(51) Int. Cl.
*H01L 21/36* (2006.01)
(52) U.S. Cl. ............... 438/479; 438/492; 257/E21.561
(58) Field of Classification Search ................. 438/479, 438/492, 478, 788, 789, 502, 509
See application file for complete search history.

(56) References Cited

U.S. PATENT DOCUMENTS

| | | | |
|---|---|---|---|
| 5,442,205 A | | 8/1995 | Brasen et al. |
| 6,464,780 B1 * | | 10/2002 | Mantl et al. ................... 117/90 |
| 6,562,703 B1 * | | 5/2003 | Maa et al. .................... 438/518 |
| 6,841,457 B2 * | | 1/2005 | Bedell et al. ................. 438/479 |
| 7,109,096 B2 * | | 9/2006 | Takizawa ..................... 438/479 |
| 2002/0185686 A1 | | 12/2002 | Christiansen et al. |
| 2004/0238885 A1 * | | 12/2004 | Bedell et al. ................. 257/347 |
| 2006/0220127 A1 * | | 10/2006 | Mantl ......................... 257/347 |

FOREIGN PATENT DOCUMENTS

| | | |
|---|---|---|
| WO | WO 02/071495 | 9/2002 |
| WO | WO 03/092058 | 11/2003 |
| WO | WO 03/098664 | 11/2003 |
| WO | WO 2004/082001 | 9/2004 |

* cited by examiner

*Primary Examiner*—Scott B. Geyer
*Assistant Examiner*—Reema Patel
(74) *Attorney, Agent, or Firm*—Andrew Wilford

(57) ABSTRACT

The invention relates to a method for producing a layer structure comprising a strained layer on a substrate. The inventive method comprises the steps of producing a defect area in a layer adjoining the layer to be strained, and relaxing at least one layer adjoining the layer to be strained. The defect area is especially produced in the substrate. Additional layers can be epitactically grown. Layer structures so produced are especially suitable for producing various types of components.

47 Claims, 2 Drawing Sheets

METHOD FOR PRODUCING A STRAINED LAYER ON A SUBSTRATE AND CORRESPONDING LAYER STRUCTURE

CROSS REFERENCE TO RELATED APPLICATIONS

This application is the U.S. national phase of PCT application PCT/DE2004/000780 filed 15 Apr. 2004 with a claim to the priority of German patent application 10318284.5 itself filed 22 Apr. 2003, whose entire disclosures are herewith incorporated by reference.

FIELD OF THE INVENTION

The invention relates to a method of making a strained layer on a substrate and a layer structure.

BACKGROUND OF THE INVENTION

The rapid developments in nanoelectronics has increasingly required more rapidly acting transistors, especially metal oxide field effect transistors (MOSFETs). A performance increase is generally obtained by the reduction of transistor dimensions.

This however can be expensive and difficult to achieve since the key technologies of chip production, like the lithographic process and the etching process must be replaced by systems which are more powerful. An alternative technique is the use of materials which are more capable of higher performance. The materials which are available for this purpose are especially strained silicon, strained silicon-germanium alloys (Si—Ge) or silicon-carbon (Si—C) and silicon-germanium-carbon (Si—Ge—C). The use of silicon or Si—Ge, Si—C or Si—Ge—C in a certain elastic strain state, improves the material characteristics, especially the preeminently important carrier mobility of the electrons and holes for electronic components. The use of these and other high quality materials enables a significant performance increase of Si based high power electronic components like MOSFETs and MODFETs without the need to reduce the critical structural sizes of the electronic components.

Such elastically strained layer systems require epitaxial growth on special substrates or stress relaxed layers, so-called "virtual substrates" whose production with low defect densities is very expensive and difficult (F. Schaeffler, Semiconductor Sci. and Tech. 12 (1997), pages 1515-1549).

Up to now the production of nanocrystalline layers with currently available substrate materials has been greatly limited or the quality of the layers has been poor. Different crystal structures as well as different lattice parameters between the substrate and the layer material (lattice mismatch) generally limited the monocrystalline growth of layers of higher quality. When monocrystalline layers are deposited with unmatched lattice parameters, these tend to grow first with mechanical stresses, that is their lattice structures differ in this state from the original. Should the deposited layer exceed a critical layer thickness, the mechanical stresses break down with defect formation and the lattice structure comes closer to the original. This process is termed stress relation and is referred to below as "relaxation".

With layer thicknesses which are required for electronic components, through this relaxation, dislocations are incorporated at the interface between the formed layer and the substrate while in a detrimental manner, many dislocations run from the interface to the layer surface (so-called threading dislocations). Since most of these dislocations travel through newly grown layers, they significantly cause deterioration of the electrical and optical properties of the material. By the terms "dislocation density" or also "defect density", such threading dislocation densities are intended.

Since the silicon germanium (Si—Ge) material system is thermodynamically a fully miscible system, the compounds can be formed with optional concentrations. Silicon and germanium are characterized indeed by the same crystallographic structure but differ with respect to the lattice parameters by about 4.2%, that is an Si—Ge-layer or a pure Ge layer can grow in a strained state on silicon. Carbon can be substitutionally incorporated into silicon only to about 2 atomic percent to reduce the lattice parameters.

Within the state of the art for the production for example of strained silicon on for example stress free qualitatively high-grade silicon-germanium alloy layers on a silicon substrate, there is the use of the so-called "graded layer" upon which in a further step the desired strained layer can be deposited. The "graded layer" can be a silicon-germanium layer whose germanium concentration increases toward the surface until the desired germanium content is achieved in a continuous or stepwise manner. Since to maintain the layer quality only an increase in the germanium content of bout 10 atom % per µm is required, such layers are up to 10 micrometer thick to achieve the current Ge concentration. The layer growth of this "graded layer" is described by E. A. Fitzgerald et al, Thin Solid Films, 294 (1997) 3-10.

This method leads disadvantageously to high layer roughnesses, to dislocation multiplication with an extremely non-homogeneous distribution of threading dislocations and thus to a crystallographic tipping of regions so that an expensive polishing of the layers is required before strained silicon can be formed on the thus made buffer in an additional epitaxy step. Because of the extremely nonhomogeneous distribution of the threading dislocations, in spite of the comparatively reduced dislocation density, locally regions with a higher dislocation density are formed at which the transistor function is very negatively effected. Before the second layer deposition, usually in a CVD reactor or in a molecular beam epitaxy apparatus, a special wafer cleaning must be carried out to ensure monocrystalline growth and to minimize the incorporation of impurities or undesired doping substances. The many drawbacks, large layer thicknesses, long growth duration, expensive polishing, cleaning and the two or more epitaxial steps that are required, reduces the output of the wafers and makes this process expensive, limits the quality and in general makes the method uneconomical. Because of the large layer thicknesses of the graded layers of several micrometers of Si—Ge, these also have a substantially poorer thermal conductivity which can give rise to a so-called "self-heating" of the electronic component so that their use in electronic components has been highly unsatisfactory.

For these reasons method of producing ultra thin stress relaxed layers of higher quality are of considerable interest.

From WO 99/38201, a method is known that permits the production of thin stress relaxed Si—Ge buffer layers. Nevertheless it is a drawback of this method that also here a plurality of expensive technological steps are required so that no ultra thin "virtual substrate" can be produced. After the epitaxial deposition of the layer to be relaxed, an ion implantation is carried out which is followed by a heat treatment, a surface cleaning and an epitaxial depositing anew.

OBJECT OF THE INVENTION

It is the object of the invention to provide a simple process for producing a strained layer on a substrate without the need for expensive wafer bonding or cleaning steps.

SUMMARY OF THE INVENTION

The object is achieved with a layer structure according to the auxiliary claim.

The method of producing a strained layer on a substrate comprises the following steps:

Producing a defected region in a layer adjacent to or neighboring the layer intended to form the strained layer.

Relaxation of at least one of the layers adjacent or neighboring the layer to form the strained layer.

For this purpose the layer structure is subjected to at least one thermal treatment and/or an oxidation so that starting with the defect region, dislocations are formed which contribute to a relaxation of a layer adjoining or neighboring the layer to form the strained layer.

As a consequence the layer to form the strained layer, is strained.

By the term "defect", crystal defects should be understood, that is atomic and extended defect locations like for example clusters, bubbles, hollows and the like. Starting from such defected regions which are produced, dislocations form which lead to a relaxation of a layer adjoining or neighboring to the layer which is to form the future strained layer.

The defect region is so produced that the dislocations give rise to a relaxation of the neighboring or adjoining layer to that which is to form the strained layer.

The defect region can especially advantageously be produced in the substrate.

Under "relaxation" is to be understood the decay of the elastic stress within the layer.

By "neighboring" layer one should understand a layer which is directly adjoining the layer to form the strained layer or is separated therefrom by one or more further layers in so far as the dislocations in that layer lead to relaxation and to a straining of the layer in which the strain is to be generated.

By "substrate" is meant the layer in the broadest sense of the word upon which the layer to be strained is deposited or can be arranged.

In the course of the process, possibly further layers can be applied.

On the free surface of the layer to form the strained layer, epitaxially at least one first layer is deposited, whereby this first layer has a different degree of stress than that of the layer to form the strained layer.

In the first layer, therefore, a defect region can be generated. The layer structure is subjected to at least one thermal treatment so that starting from the defect region, dislocations will be formed which lead to a relaxation of the first layer. As a consequence thereof the layer therebelow is strained.

As a first layer, a graded layer can also be understood whereby at the interface with the layer to form the strained layer, the graded layer has a different degree of stress than that of the layer to be strained. Then in the graded layer a defect region is generated. The layer structure is subjected to a thermal treatment so that starting from this defect region dislocations will be formed that give rise to relaxation of the region of the graded layer arranged on the layer to form the strained layer. As a consequence that layer is strained where it bounds the graded layer.

In the course of the method according to the invention, the layer to form the strained layer is transformed into an elastically strained layer. To that end the layer bounding the layer to form the strained layer is relaxed thereby causing the desired strained state to develop in the layer to be strained. In the case of a graded layer as the first layer, the layer region of the graded layer which bounds the layer to be strained relaxes thereby transforming the layer to be strained into the desired strained state. The layer applied to the layer to form the strained layer has a different degree of stress than the strained layer itself.

In the course of the method it is possible to apply other layers as well.

According to the invention between a layer to be strained and the substrate a further layer which in the course of the process is also relaxed, can be provided. One thus obtains on a substrate a relaxing layer upon which a layer to form the strained layer is applied. To the latter in the further course of the method another layer capable of being relaxed can be applied to the layer adapted to form the strained layer. On this layer capable of being relaxed another layer adapted to form a strained layer can be applied. Further layers can likewise be provided. The relaxed layers have a different degree of stress than the neighboring layers to form the strained layers. After relaxing of the layers, the layers which are intended to form the strained layers develop that strain in a process step involving thermal treatment or oxidation.

That means that it is possible to relax several layers and thereby produce several strained layers in a single process step during the thermal treatment or oxidation. The layers can then be at least partly removed. In this manner, at least one strained layer can be produced on a very thin relaxed layer.

Such an epitaxial layer structure or wafer can advantageously be made in a single deposition process. Especially advantageously, the wafer can be permitted to remain in the reactor and layers can be deposited thereon without expensive polishing and cleaning steps.

Since the epitaxial layer structure as a rule should be held relatively thin, for example smaller than about 500 nanometers and especially smaller than 200 nanometers, a sufficient thermal conductivity can be ensured within the entire layer sequence.

By the choice of the strain to which the layer adapted to form the strained layer is to be subjected, that is between tensile strain or compression strain, a resulting strain can be selected for the layer intended to form the strained layer.

In order to effect the relaxation of the layer adjacent to or neighboring the layer to be strained and thus bring about the application of strain to that layer, that layer structure is advantageously subjected to at least one thermal treatment. It is however conceivable to utilize another treatment instead of the thermal treatment so that the neighboring or adjacent layer to that which is to be strained, can be relaxed and the strained layer produced.

Thus it is especially preferred to carry out the relaxation by means of oxidation with $O_2$ or hydrogen. Instead of a purely thermal treatment to form the relaxed region, an oxidation can follow the thermal treatment or a combination of oxidation and thermal treatment can be used. For this purpose the concentration of the elements which are important for the functioning of the electronic component can be increased within the layer structure (for example Ge enrichment in Si—Ge).

As materials for the substrate, especially for example silicon, SOI substrate, SiC, graphite, diamond, quartz glass, GdGa-garnet or also III-V semiconductor and III-V nitride should be considered.

The method of the invention has a number of advantages. Advantageously, with this process the generation of a strained layer requires only a single epitaxial deposit and no expensive time consuming process steps like wafer bonding and polishing (CMP).

It is also advantageous that apart from silicon, commercially available SOI substrate with a thin Si surface layer to be strained can form the basic structure for the substrate. Also silicon on sapphire, BESOI or SIMOX wafer can be selected as the substrate. The SIMOX wafer has indeed as a rule a dislocation density of about $10^5$ cm$^{-2}$, most usually $10^2$ to $10^3$ cm$^{-2}$ and thus has good layer homogeneity and purity as well as the ability to be produced by an economical process.

The method uses process steps which are established in silicon technology. The technology can be adapted also for use with very large wafers, for example 300 millimeter wafers.

The defect region can be produced by ion implantation.

In a further feature of the invention, for the temperature [thermal] treatment a suitable condition is a temperature between 550° C. and 1200° C. and especially between 700° C. and 950° C. As a result starting from a defect region in the second layer, defects are formed under these conditions, especially dislocations, which permit relaxation of the first layer, whereby the layer to be strained has strain imparted to it.

By the choice of the strain of the first layer, between tensile strain or compressive strain, the resulting type of strain in the layer to be strained is selected. If the first layer is compressively stressed before the thermal treatment, for example by the choice of Si—Ge as the material for the first layer (with optional concentration, then the layer to be strained, for example comprising silicon, will have tensile strain.

The Si—Ge layer can be replaced by the use of a tension-strained first layer of for example Si—C with up to about 1 to 2 atomic % carbon to produce compression strained silicon. The use of ternary alloys like Si—Ge—C and the use of doped Si layers or alloys (boron, arsenic, phosphorus, antimony, erbium, sulfur or others) is also possible.

The thermal treatment can be carried out in an inert atmosphere, or also in an oxidizing environment, for example in $O_2$ or $H_2O$, or in a nitriding atmosphere, for example $NH_3$ or in a reducing atmosphere, for example in forming gas. Very good results are obtained when the thermal treatment is carried out in nitrogen.

The thus produced strained layer or the strained layers can be exposed, for example by a wet chemical removal of layers.

The removal of one or more layers can also be effected by means of an additional hydrogen or helium implantation. Alternatively, etching or grinding or a combination thereof can be used. The removal can be carried out such that either only the further epitaxial layer or also the layer structure can be transferred to a new wafer, as a rule onto $SiO_2$. Especially in the case of Si—Ge layers as the layer structure, these advantageously can be selectively etched. In this manner for example strained silicon can be produced directly on $SiO_2$. As a separating plane, advantageously a plane is selected in which previously helium or hydrogen bubbles have been produced. In this manner advantageously even very thin layers can be removed and for this purpose the required implantation dose can be reduced. The defect region provided for the relaxation can also be used to getter hydrogen which can be implanted substantially more deeply, that is with higher energy, and so contribute to the layer separation. An implantation of the hydrogen or helium with higher energy gives rise to less damage to the already relaxed and strained layers and thus contributes to a higher output of the wafers or layer structures since as a rule implantation apparatus at higher energies, for example greater than 50 keV supply greater ion currents.

The liberated or exposed layer structure can be used to build up more complex layer structure. For this purpose the skilled worker in the art can use all commercially available process and layer materials depending upon the layer structure to be formed and the particular requirements the layer structures are to satisfy.

All substrates can be used as have been described including silicon, SOI structures, silicon on sapphire, SIMOX-wafers or BESOI structures. In these cases, the layer to be strained, the insulator and the substrate become the base structure.

The layer to be strained can advantageously be selected to be silicon. The layer to be strained can advantageously have a thickness of 1 to 100 nanometers, especially 5 to 40 nanometers.

This layer thickness should not exceed the critical layer thickness and must be so small that at least a substantial part of the dislocations from the first layer will also spread along their slip planes into this layer.

These thicknesses depend especially upon the degree of stress in the first layer and its layer thickness. The greater the desired stress of the layer the smaller must the thickness of the layer to be strained be.

A large layer thickness ratio of a layer to be relaxed to a layer to be strained appears to be advantageous, especially a layer thickness ration greater than 10.

In an especially advantageous feature of the invention, as the first layer on a layer to be strained, an epitaxial Si—Ge or Si—Ge—C or SiC layer is deposited which has a thickness advantageously close to the critical layer thickness. The critical layer thickness defines the maximum thickness for this first layer in which a defect free growth is still possible on the layer to be strained but which is not lattice matched thereto. With a layer thickness below this critical layer thickness as a rule strictly pseudomorphic growth that is completely defect free is produced. The critical layer thickness should not be exceeded to such an extent that the layer is already noticeably relaxed.

Alternatively to a layer with constant composition, a graded layer can also be used which is disposed on a substrate below a layer to be strained. That means that the composition can increase or drop within the graded layer. In the case of Si—Ge, the Ge concentration can be reduced away from the substrate progressively slowly or in steps or can have an increasing Ge concentration or can be composed of pure germanium (Ge) after only a few nanometers of growth. If in spite of this a sufficient layer thickness is to be maintained without exceeding the critical layer thickness, the Ge concentration can be allowed to fall rapidly, for example to 25 atomic %. Under these conditions the layer thickness can still be about 80 nanometers. The region with the higher Ge concentration enables a high degree of relaxation above 80%.

Also a U-concentration profile can be of advantage in order to provide the Ge concentration of for example 20 to 40 atomic % with the greatest possible degree of relaxation for the first layer to thereby produce a high degree of strain in the layer to be strained.

In that case it is advantageous to select a thickness of the first layer which is as large as possible so that the stress relaxation can be carried out efficiently.

At a constant Ge concentration of 20 atomic % Ge, a maximum layer thickness of about 400 nanometers can be produced. A complex concentration profile is of advantage for higher Ge content.

Optionally also a further layer, for example to avoid surface roughening by blistering after a hydrogen or helium implantation, can be deposited on the layer structure. This layer can be amorphous or polycrystalline. This layer can be deposited before or after generating the defect region for example by ion implantation. The layer thickness of this optional layer need only be determined by the implantation parameters.

The material and thicknesses of the individual layers given here are intended to be by way of example only and it will be self understood that they do not create a limitation of the invention.

Advantageously the thickness of a second or further layer to be relaxed also should be selected to be as large as possible.

The layer to be strained is then optionally arranged between two relaxing layers and the relaxation can be carried out especially efficiently. It is especially advantageous for at least one very thin strain layer to be provided on at least one relaxed layer, especially strained silicon on relaxed Si—Ge. As has been indicated however it is also possible to produce a plurality of layers to be strained and a plurality of relaxed layers.

In an especially advantageous feature of the invention by arranging a mask on the layer structure, a locally limited defect region can be produced. For that purpose it has been found to be especially advantageous that from the layer to be strained, locally strained and unstrained regions in a plane are produced, that is in a plane directly adjoining one another and without step formation as has previously been the case in the state of the art. The relaxation and the straining of the layer thus can be found only in the regions beneath the unmasked parts.

The defect region or regions can, especially advantageously, be made by ion implantation, primarily with light ions like hydrogen ($H^+$, $H_2^+$) helium, fluorine, boron, carbon, nitrogen/sulfur and so forth or by ions of the layer material or of the substrate material itself, thus for example silicon or geranium with an Si/Si—Ge heterostructure.

It is advantageous to use ions which will avoid undesired contamination or doping of the structure. In this sense, inert gas ions, for example Ne, Ar, Kr and so forth can be used.

For hydrogen or helium ions, a dose about $3 \times 10^{15}$ to $3.5 \times 10^{16}$ cm$^{-2}$, especially $0.4 \times 10^{16}$ to $2.5 \times 10^{16}$ cm$^{-2}$ is used. Also suitable is a combination of two implantations, for example first hydrogen and then helium or first boron and then hydrogen. A boron implantation in combination with a hydrogen implantation allows the dose of the hydrogen implantation to be reduced. Also a thermal treatment between the implantations can be advantageous to produce nucleation seeds for the defect formation.

The defect region is advantageously produced at a spacing of 50 to 500 nanometers from the layers to be relaxed.

In a further feature of the invention, a defect region is produced in the substrate and crystal defects in the remaining layer structure. This applies especially for ions which lead to bubble formation as, for example, hydrogen, helium, fluorine, neon or argon.

Advantageously, with a silicon implantation by comparison with very light ions like, for example, hydrogen or helium ions, the dose can be significantly reduced, that is especially by a factor of 10 to 100. This shortens certainly the implantation time and increases the wafer output significantly.

With the goal of achieving a higher degree of relaxation also when two or more implantations are used, the defect formation in the substrate and in the first layer can be brought about or adjusted independently from one another.

An advantageous mode of operation is thus to provide one or more implantations with different energies and possibly with different ions in the first layer with a reduced dose and with a second implantation to then form the defect region in the second layer.

The production of point defects in the first layer to be relaxed gives rise to accelerated diffusion and to greater relaxation.

The ion implantation can be carried out over the entire surface or through the use of an implantation mask, for example a photo lacquer layer on optional locations of the wafer.

In a further feature of the invention, the wafer is not held at an angle of 7° for the implantation as in the state of the art. Rather the wafer is tilted at an angle greater than 7° to the normal, especially an angle of 30° to 60°.

With the method it is possible to produce strained and nonstrained layers adjacent one another while ensuring planarity without steps. This latter is possible since the subsequent treatment can be carried out with such a small thermal budget that nonimplanted regions of the first layer on the layer to be strained and/or a second layer below the layer to be strained will not be relaxed or will be relaxed only slightly and the layer to be strained in this region will not develop strain or be altered to match the implantation mask to the layout of the electronic components or the insulation regions. Only the regions where, for example, strained silicon is required for the electronic components are implanted.

The transition regions between strained and unstrained regions are advantageously configured as insulation regions between the electronic components. Especially advantageously, silicon dioxide is again selected as the insulation material.

On the strained region thus produced, further epitaxial layers can be deposited in order to increase for example the layer thickness of the strained region or locally on the wafer to match those regions or to provide new layers, for example, to realize complex electronic or optoelectronic components.

With the method according to the invention, one or more strained regions can be produced which advantageously have an extremely small surface roughness as a rule less than one nanometer and only a small defect density of less than $10^7$ cm$^{-2}$, especially less than $10^5$ cm$^{-2}$. The low degree of roughness is especially advantageous for the production of MOSFETS where a thermal oxide or another dielectric, for example a high-k dielectric, that is a material with higher dielectric constant, is produced on the strained layer. The surface roughness influences very sensitively the electrical quality of the dielectric which is the heart of the transistor. Also the mobility of the charge carriers are greatly dependent upon the interface in a very thin layer. The surface roughness of, for example, the strained silicon can be further reduced by the growth of a thermal oxide. The thus formed oxide can be removed prior to the growth or deposition of the gate dielectric.

The method makes available in a further, especially advantageous, feature of the invention, the potential for further reduction of the defect density in the relaxed and the strained layer.

This can be achieved by the etching of trenches in the layers with micrometer spacing, especially 1 to 100 micrometer or advantageously by etch trenching electronic component structures and subsequent thermal treatment above 500° C.

Threading dislocations in the layer then slip to the edge of this region and are so healed. Etch trenches can in addition also form so called shallow trench insulation. For this purpose the trenches can be filled with insulator material and thus electrically separate the electronic components from one another.

The production of a system on a chip, that is different electronic components with different functions in a plane is thus also advantageously within the scope of the invention.

As has already been indicated, strained and nonstrained layers can be made while maintaining their planarity. This enables the production of special electronic components and circuits with strained or nonstrained region of for example silicon. These especially very thin layers can locally be reinforced by deposition, for example, by selectively depositing contacts for the source and drain, so-called "raised source and drain" and can enable the fabrication of power electronic components.

For the production for example of p and n channel MOSFETs, the so formed strained silicon layers can advantageously be used since the electron and hole mobilities in the tetragonal lattice of strained silicon is about 100% to about 30% increased by comparison with unstrained silicon when the lattice strain is greater than 1%. In that case one is not bound to particular transistor types or electronic components.

MODFETs, resonant tunnel diodes, photodetectors and quantum cascade layers can be realized.

BRIEF DESCRIPTION OF THE DRAWING

In the following the substance of the invention is described in greater detail with reference to seven figures and embodiments without limiting the scope of the invention thereto. The figures show.

SPECIFIC DESCRIPTION

Figure 1:
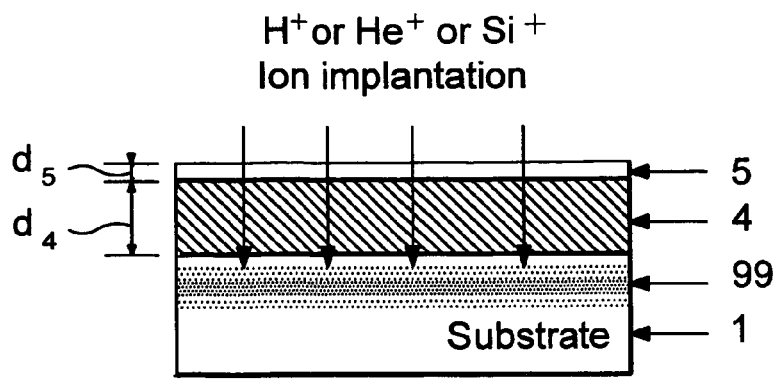
FIG. 1: a schematic diagram of the layer system, comprising a substrate 1 and a two-layer epitaxially applied layer structure comprised of a layer 4 to be relaxed and a layer 5 to be strained and a defect region 99 produced by ion implantation.

FIG. 1 shows the production of a layer 5 adapted to form the strained layer on a layer 4 to be relaxed on a substrate 1. The layer growth is effected preferably by gas phase epitaxy or with molecular beam epitaxy. Upon a silicon substrate 1, an epitaxial layer 4, for example a silicon-germanium (Si—Ge) layer is deposited with a germanium concentration of for example 30 atomic percent germanium and a layer thickness $d_4$ of 10-500 nm. Then the layer 5 to be strained (for example, Si) is deposited with a layer thickness $d_5$ of, for example, 1 to 50 nm. It is to be noted that a higher layer thickness $d_4$ is of advantage since as a rule this tends to smaller dislocation densities and higher degrees of relaxation in the stress-relaxed virtual substrate.

Figure 2:
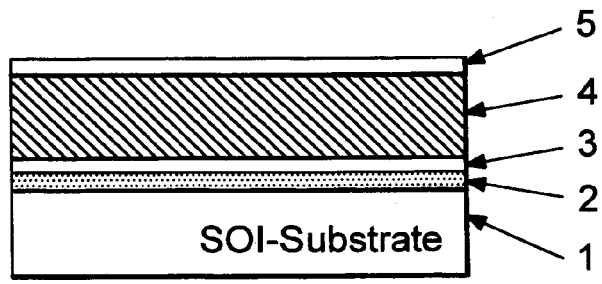
FIG. 2 a schematic illustration of a layer system comprised of an SOI-substrate formed of silicon 1, an insulation layer 2 and a silicon surface layer 3 as well as an epitaxially applied layer structure of the layers 4 and 5, whereby the layer 3 and/or layer 5 are to be strained, border upon the layer 4 to be relaxed.

Alternatively thereto, as has been illustrated in FIG. 2, the above described layer system comprised of the layers 4 and 5 can be deposited on an SOI substrate (Si-Wafer 1 with buried amorphous $SiO_2$ layer 2 and an Si surface layer 3 with a thickness of, for example, 50 nm) instead of on an Si wafer.

Figure 3:
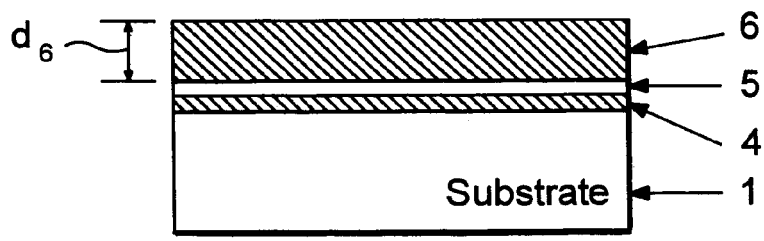
FIG. 3 a schematic illustration of a layer system corresponding to FIG. 1 whereby above the layer 5 to be strained, a further layer 6 is found which is to be relaxed.

Alternatively to FIG. 1, as can be seen from FIG. 3, the layer 5 to be strained has a further layer 6 with a layer thickness $d^6$ of, for example, 10 to 500 nm (for example Si—Ge with the same Ge concentration as in FIG. 4 or a different Ge concentration) grown thereon to achieve a symmetrical stress pattern. Upon relaxation of the layers 4 and 6 and the application of strain to layer 5, the layer 6 can be removed. In this manner one can produce a strained layer 5 on a very thin relaxed layer 4.

Figure 4:
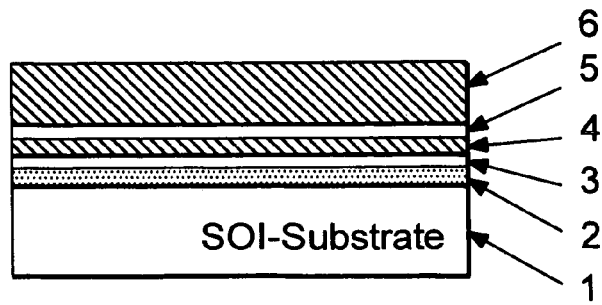
FIG. 4: a schematic layer system corresponding to FIG. 2 whereby upon the layer 5 to be strained is a further layer 6 to be relaxed.

As an alternative to FIG. 2, as has been shown in FIG. 4 the layer 5 to be strained with a further layer 6 grown thereon, for example SiGe with the same or different Ge communication than the layer 4) is used to produce a symmetrical stress pattern. After the relaxation of the layers 4 and 6 and the application of strain to the layer 5, layer 6 is removed. In that manner a strained layer 5 is provided on a very thin relaxed layer 4.

Figure 5:
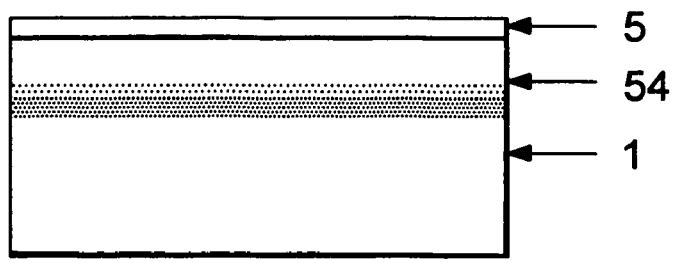
FIG. 5 a schematic layer system corresponding to FIG. 1 where the layer structure 54 to be relaxed has a gradual concentration pattern perpendicular to the layer plane.

As an alternative to FIG. 1, one can operate as shown in FIG. 5 wherein instead of an SiGe layer 4 an Si—Ge layer 54 with a sharply nonhomogeneous concentration pattern is produced as illustrated by the gradient in gray coloration in the layer. For example in a 200 nm thick layer 54 the Ge concentration from 50 atomic % at the beginning (darkest region) drops to 25 atomic % (clearer region near the layer 5). The total layer thickness must in all cases lie below the layer thickness at which significant stress relaxation (for example 5%) will take place already during the growth) occurs. On this layer 54 the layer 5 to form the strained layer is deposited.

Figure 6:
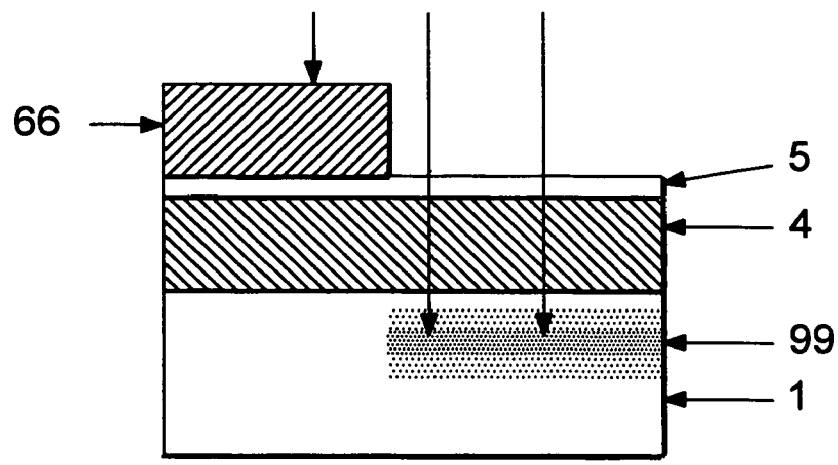
FIG. 6 A schematically illustrated layer system comprised of a substrate with a buried structure 99, a two-layer epitaxially applied layer structure (4 or 5), an implantation mask 66 as well as a layer 5 to be strained after heat treatment.

Below these deposited layers in all of the described embodiments a defect region 99 can be produced, for example by ion implantation (see FIGS. 1 and 6). For this purpose advantageously a helium implantation can be carried out with a dose of about $1 \times 10^{16}$ cm$^{-2}$. The energy of the ions is so matched to the layer thicknesses that the mean range of the ions lies about 50 to 500 nm below the first interface, that is in the substrate. As an alternative to the helium implantation, in this example also an Si implantation for example with an energy of about 150 keV and a-dose of about $1 \times 10^{14}$ cm$^{-2}$ for 100 nm layer thickness of the silicon-germanium (Si—Ge) layer 4 and 20 nm layer thickness of the silicon layer 5. The implanted ions produce crystal defects in and beneath the SiGe layers 4, 6. The ion implantation can be laterally limited by a mask 66 to produce locally strained layers on relaxed layers.

Then, for several minutes a thermal treatment is carried out in the form of a tempering, i.e. a heat treatment at 900° C. in an inert $N_2$ atmosphere. Another inert gas (for example argon) or a gas which is suitable for the purposes of the invention (for example $O_2$ or forming gas) can be used. Above the defect region 99, with this temperature beginning which is selected not to be too high, a stress relaxed silicon germanium (Si—Ge) layer structure 4, 6 is formed together with a strained layer 5. The layer 5 can for example be of silicon or also of silicon germanium (Si—Ge) with a different germanium concentration than that in the epitaxial layers 4 or 6, or from a multiple layer. In the case of silicon, strained silicon is produced. In the case of Si—Ge, strained Si—Ge is produced. Because of the thinness of the layers 4, 5, 6 a planarity of the layers in the sense of the depth of field of a lithographic process as well as the thermal conductivity to the substrate are ensured.

The heat treatment or oxidation temperature can be matched to the requirement of the total layer system and to the electric component making process and can be reduced therefore to particularly low temperatures. For example a layer relaxation can be achieved with a suitable ion implantation already at a temperature of 600° C.

An oxidation produces a germanium enrichment at the Si—Ge layer 6 close to the surface. As a result a greater strain in the layer 5 is produced.

Layer sequences 4, 5, 6 according to the invention on the substrate can as in FIG. 1 have a thickness of about 50 to 500 nm or less to fulfill these requirements.

Layer 5 from FIGS. 1 to 7, for example strained silicon, can be used advantageously to produce ultrafast MOSFETs, especially n-channel and p-channel MOSFETs, because of the higher mobility of the charge carriers.

Figure 7:
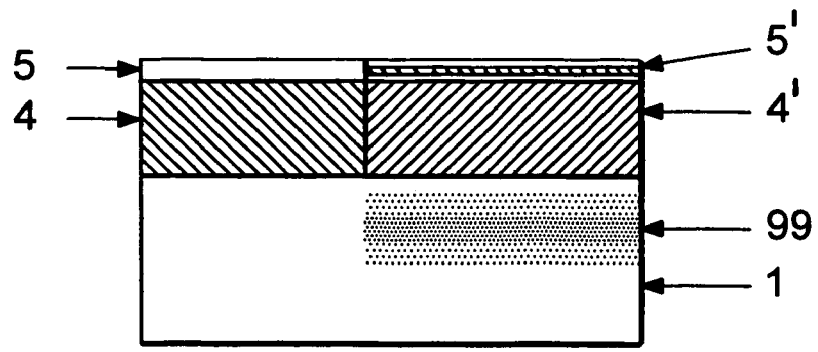
FIG. 7 a schematically illustrated layer system corresponding to FIG. 6, whereby after implantation and heat treatment has a relaxed layer 4' and a strained layer 5' while in the masked region a strained layer 4 and an unstrained layer 5 are provided.

In the regions below a mask, in which the layers 4 and 6 of the Si—Ge structure after the implantation are not relaxed, advantageously, p-MOSFETs can be produced. These regions arise as shown in FIG. 7 when, for example during the ion implantation a mask is used. Since usually only the regions of the layers 4 or 6 of the layer structure relax which lie above a buried defect region of a substrate, the regions of the layers 4 or 6 of the layer structure which are located in the regions protect by or below the mask usually remain stressed and the corresponding layer 5 unstrained in this region.

Starting from the structures shown in FIG. 1 or 3, the strained layer 5 (optionally together with layer 6) can be bonded to a further Si wafer (not shown) provided with an $SiO_2$ layer. After hydrogen implantation with a dose of for example $5\times10^{16}$ $H_2^+$ $cm^{-2}$ and heat treating at, for example, 400° C., the substrate 1 can be removed. In addition, the layer 4 can be removed. If the layer 6 is held sufficiently thin, for example 50 nm, fully depleted MOSFET transistors can be produced with this layer structure.

It can however also start with other layer sequences and processing:

Apart from silicon germanium (Si—Ge) and Si—Ge—C and Si—C as epitaxial layers 4 and 5, or 6, generally all III-V compounds, especially III-V nitrides (GaN, AlN, InN) as well as oxidic perovskites can be used as epitaxial layers. What is important in each case is only that suitable materials be deposited on a suitable substrate so that at least one layer with a different lattice structure can be produced on a thus generated "virtual substrate". Thereafter the production of the electronic components for example transistors, can be carried out.

The layer sequences made according to the method of the invention can be used especially to produce metal oxide semiconductor field effect transistors (MOSFETs) and modulated doped field effect transistors (MODFETs) it is also possible to make resonant tunnel diodes, especially a resonant Si—Ge tunnel diode or a quantum cascade laser on such a "virtual substrate". Furthermore, it is conceivable to produce a photodetector from one of the layer sequences. In addition it is conceivable starting with a layer sequence of, for example, GaAs, GaN or InPals as the layer 2 on a virtual substrate of silicon germanium (Si—Ge) 1 to produce a laser.

The invention claimed is:

1. A method of making a strained layer on a substrate, the method comprising the steps of:
   providing on the substrate in a single epitaxial deposit a first epitaxial relaxing layer and on it a second epitaxial layer to be subjected to strain;
   generating with ion implantation a defect region in a layer neighboring the second epitaxial layer to be subjected to strain; and
   relaxing a layer neighboring the second epitaxial layer to strain the second epitaxial layer.

2. The method according to claim 1 wherein dislocations extend from a defect region which give rise to a relaxation of one of the layers neighboring the layer to be strained.

3. The method according to claim 1 wherein the first epitaxial layer neighboring the second epitaxial layer is subjected to at least one thermal treatment or oxidation for relaxation.

4. The method according to claim 1 wherein the defect region is produced in the substrate.

5. The method according to claim 1 wherein at least one further epitaxial layer is epitaxially deposited on the layer to be strained.

6. The method according to claim 5 wherein the further epitaxial layer has a different degree of strain than the second epitaxial layer.

7. The method according to claim 5 wherein the first epitaxial layer is relaxed.

8. The method according to claim 1, further comprising the step of
   depositing a further layer between the layer to be strained and the substrate.

9. The method according to claim 8 wherein the further layer has a different degree of strain than the layer to be strained.

10. The method according to claim 1 wherein a plurality of layers are relaxed.

11. The method according to claim 1 wherein a plurality of layers to be strained are strained.

12. The method according to claim 1 wherein an epitaxial layer structure comprised of a plurality of layers on a substrate is made in a single deposition process.

13. The method according to claim 1 wherein applied layers are thereafter removed.

14. The method according to claim 1 wherein at least one strained layer is produced on a thin relaxed layer.

15. The method according to claim 1, further comprising the step of
   removing a layer by means of hydrogen or helium implantation.

16. The method according to claim 1 wherein the defect region is used as a separating plane.

17. The method according to claim 1 wherein for ion implantation, hydrogen ions or helium ions are used.

18. The method according to claim 17 wherein ions with a dose of $3\times10^{15}$ through $4\times10^{16}$ $cm^{-2}$ are used for producing the defect region.

19. The method according to claim 1 wherein Si ions are used for the implantation.

20. The method according to claim 19 wherein a dose of $1\times10^{13}$ to $5\times10^{14}$ $cm^{-2}$ is used to produce the defect region.

21. The method according to claim 1 wherein for the implantation, hydrogen ions, carbon ions, nitrogen ions, fluorine ions, boron ions, phosphorous ions, arsenic ions, silicon ions, germanium ions, antimony ions, sulfur ions, neon ions, argon ions, krypton ions or xenon ions or an ion type of the layer material itself is used for producing the defect region.

22. The method according to claim 1, further comprising the step of
   effecting a relaxation over a limited region of at least one layer.

23. The method according to claim 1, further comprising the step of
arranging a mask on the layers.

24. The method according to claim 1 wherein the one layer is relaxed only on the implanted region or is stressed.

25. The method according to claim 1 wherein the one layer is primarily irradiated with ions.

26. The method according to claim 1 wherein hydrogen or helium is implanted to a considerable depth and during a subsequent heat treatment, collects in a defect region and thus enables separation.

27. The method according to claim 26 wherein the dose for the hydrogen or helium implantation can be reduced for the separation.

28. The method according to claim 1 wherein in the layers primarily crystal defects or in the substrate proximal to the epitaxial layer an extended defect region is produced.

29. The method according to claim 1 wherein the energy of the implanted ions is so selected that the mean range is greater than the total layer thickness of the epitaxial layer.

30. The method according to claim 1 wherein the thermal treatment is carried out in a temperature range of 550 degrees C. to 1200 degrees C.

31. The method according to claim 1 wherein the thermal treatment is carried out in an inert, reducing, nitriding or oxidizing atmosphere.

32. The method according to claim 1 wherein the dislocation density after the growth amounts to less than $10^5$ cm$^{-2}$.

33. The method according to claim 1 wherein a strained layer or an unstrained layer with a surface roughness of less than 1 nanometer is produced.

34. The method according to claim 1 wherein layers comprising silicon, silicon-germanium or silicon-germanium-carbon or silicon carbide are deposited upon the substrate.

35. The method according to claim 1 wherein layers comprised of a III-V nitride, a II-VI compound semiconductor or an oxidic perovskite is deposited on the substrate.

36. The method according to claim 1 wherein Si—Ge is used as the material for at least one of the layers to be relaxed.

37. The method according to claim 1 wherein two Si—Ge layers are relaxed.

38. The method according to claim 1 wherein at least one layer with an additional carbon content of one to two atomic percent is provided and is relaxed.

39. The method according to claim 1 wherein an SOI substrate is used.

40. The method according to claim 1 wherein an Si layer with a layer thickness below 200 nanometers is used.

41. The method according to claim 1 wherein silicon, silicon germanium, silicon carbide, sapphire or an oxidic perovskite or a III-V or II-VI compound semiconductor is used as the substrate.

42. The method according to claim 1 wherein a wafer bonding is carried out.

43. The method according to claim 1 wherein the layers are bonded to a second substrate.

44. The method according to claim 1 wherein the layers are bonded to the substrate with an SiO$_2$ layer.

45. The method according to claim 1 wherein the substrate is removed.

46. The method according to claim 1 wherein on a strained silicon region an n- or p-MOSFET is produced.

47. The method according to claim 1 wherein on at least a strained silicon germanium region as a nonrelaxed region of a layer, a p-MOSFET is produced.

* * * * *